United States Patent
Hong et al.

(10) Patent No.: US 12,148,760 B2
(45) Date of Patent: Nov. 19, 2024

(54) DRIVE SUBSTRATE, MANUFACTURING METHOD THEREOF AND DISPLAY PANEL

(71) Applicant: Shenzhen China Star Optoelectronics Semiconductor Display Technology Co., Ltd., Guangdong (CN)

(72) Inventors: Ri Hong, Guangdong (CN); Qian Ma, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/623,322

(22) PCT Filed: Dec. 16, 2021

(86) PCT No.: PCT/CN2021/138940
§ 371 (c)(1),
(2) Date: Dec. 28, 2021

(87) PCT Pub. No.: WO2023/103025
PCT Pub. Date: Jun. 15, 2023

(65) Prior Publication Data
US 2024/0072063 A1 Feb. 29, 2024

(30) Foreign Application Priority Data
Dec. 6, 2021 (CN) .......................... 202111511330.3

(51) Int. Cl.
*H01L 29/04* (2006.01)
*H01L 27/12* (2006.01)
(Continued)

(52) U.S. Cl.
CPC ...... *H01L 27/1225* (2013.01); *H01L 27/1218* (2013.01); *H01L 27/1255* (2013.01); *H01L 27/127* (2013.01)

(58) Field of Classification Search
CPC ............. H01L 27/1225; H01L 27/1255; H01L 27/127; H01L 29/7869; H01L 29/4908;
(Continued)

(56) References Cited

U.S. PATENT DOCUMENTS

| 2011/0073918 A1* | 3/2011 | Makita ................ H01L 27/1218 438/166 |
| 2017/0083129 A1 | 3/2017 | Jin |
| 2020/0168638 A1 | 5/2020 | Je et al. |

FOREIGN PATENT DOCUMENTS

| CN | 107664891 | 2/2018 |
| CN | 107731858 | 2/2018 |

(Continued)

OTHER PUBLICATIONS

International Search Report and the Written Opinion Dated Aug. 25, 2022 From the International Searching Authority Re. Application No. PCT/CN2021/138940 and Its Translation Into English. (15 Pages).

(Continued)

*Primary Examiner* — Niki H Nguyen (57) ABSTRACT

The present application discloses a driving substrate, a manufacturing method thereof, and a display panel. The driving substrate comprises a substrate, a first thin film transistor, a second thin film transistor, a first capacitor, and a second capacitor. The first thin film transistor comprises a first gate electrode first capacitor located on the substrate, the first capacitor comprises a first electrode plate and a second electrode plate, the second electrode plate is located above the first electrode plate, the first gate electrode is also used as the first electrode plate, the second capacitor comprises a second electrode plate and a third electrode plate, and the third electrode plate is located above the second electrode plate.

14 Claims, 6 Drawing Sheets

(51) Int. Cl.
*H01L 29/10* (2006.01)
*H01L 31/00* (2006.01)

(58) Field of Classification Search
CPC .......... H01L 27/1214; H01L 27/12; H01L 29/42384; H01L 29/78648; H01L 27/1251; H01L 29/41733; H01L 29/66742; H01L 29/458; H01L 27/156; H01L 25/0753; H01L 25/167; H01L 29/78645; H01L 29/78633; H01L 28/40; H01L 27/105; H01L 29/517; H01L 27/14643; H01L 29/78663; H01L 29/78651; H01L 29/6675; H01L 27/14616; H01L 27/092; H01L 21/288; H01L 21/77; H01L 27/153; H01L 2924/13069; H01L 27/1464; H01L 29/66598; H01L 29/42324; H01L 29/0665; H01L 29/0649; H01L 29/775; H01L 29/4236; H01L 29/66825; H01L 27/1463

See application file for complete search history.

(56) References Cited

FOREIGN PATENT DOCUMENTS

| | | | | |
|---|---|---|---|---|
| CN | 108493198 | | 9/2018 | |
| CN | 109273409 | | 1/2019 | |
| CN | 109300915 | | 2/2019 | |
| CN | 110444116 | | 11/2019 | |
| CN | 111564458 | | 8/2020 | |
| CN | 111785759 | | 10/2020 | |
| CN | 111785759 A | * | 10/2020 | ............ G09F 9/301 |
| CN | 111863837 | | 10/2020 | |
| CN | 112234091 | | 1/2021 | |
| CN | 113707089 | | 11/2021 | |
| CN | 113745325 | | 12/2021 | |

OTHER PUBLICATIONS

Notification of Office Action and Search Report Dated Feb. 5, 2023 From the State Intellectual Property Office of the People's Republic of China Re. Application No. 2021111511330.3 and Its Translation Into English. (19 Pages).

* cited by examiner

DRIVE SUBSTRATE, MANUFACTURING METHOD THEREOF AND DISPLAY PANEL

RELATED APPLICATIONS

This application is a National Phase of PCT Patent Application No. PCT/CN2021/138940 having International filing date of Dec. 16, 2021, which claims the benefit of priority of Chinese Patent Application No. 202111511330.3 filed on Dec. 6, 2021. The contents of the above applications are all incorporated by reference as if fully set forth herein in their entirety.

FIELD AND BACKGROUND OF THE INVENTION

The present application relates to the field of display technology, in particular to a drive substrate, a manufacturing method thereof and a display panel.

The LTPO (Low Temperature Polycrystalline Oxide) thin film transistor, which is obtained by combining LTPS (Low Temperature Polycrystalline) thin film transistor technology and Oxide thin film transistor technology, has the advantages of the LTPS display panel such as high resolution, high reaction speed, high brightness, high aperture ratio and the like, as well as the advantages of low production cost and low power consumption.

However, the prior art LTPO thin film transistor has a small capacitance charge storage capability, a large film thickness, and a complicated manufacturing process.

Therefore, it is necessary to provide a new technical solution to solve the above technical problems.

SUMMARY OF THE INVENTION

Embodiments of the present application provide a driving substrate, a manufacturing method thereof, and a display panel for solving that technical problem that the prior art LTPO thin film transistor has a small capacitance charge storage capacity.

An embodiment of the present application provides a drive substrate, comprising:
 a substrate;
 a first thin film transistor disposed on the substrate and comprising a first gate electrode;
 a second thin film transistor disposed on one side of the first thin film transistor;
 a first capacitor disposed on the substrate, wherein the first capacitor comprises a first electrode plate and a second electrode plate, the second electrode plate is disposed above the first electrode plate, and the first electrode plate and the second electrode plate are at least partially overlapped, wherein the first gate electrode is also used as the first electrode plate; and
 a second capacitor comprising the second electrode plate and a third electrode plate, wherein the third electrode plate is disposed above the second electrode plate, and the second electrode plate and the third electrode plate are at least partially overlapped.

In the driving substrate provided in the embodiment of the present application, the first thin film transistor comprises a first active layer, the first gate electrode, a first source electrode and a first drain electrode, the third electrode plate and the first source electrode and the first drain electrode are disposed in the same layer, and the third electrode plate is disposed between the first source electrode and the first drain electrode; and
 the second thin film transistor comprises a second active layer, a second gate electrode, a second source electrode, and a second drain electrode, wherein the second source electrode and the first source electrode are disposed in the same layer, and the second electrode plate and the second active layer are disposed in the same layer.

In the drive substrate provided in the embodiment of the present application, the drive substrate further comprises:
 a first gate insulating layer disposed on a side of the first active layer away from the substrate, wherein the first gate electrode is disposed on a side of the first gate insulating layer away from the substrate;
 a light shielding layer, disposed in the same layer as the first gate electrode, wherein an orthographic projection of the second active layer on the substrate covers an orthographic projection of the light shielding layer on the substrate;
 a second gate insulating layer, covering the first gate electrode and the light shielding layer, wherein the second electrode plate and the second active layer are disposed on a side of the second gate insulating layer away from the substrate;
 a third gate insulating layer, disposed on a side of the second active layer away from the substrate, wherein a second gate electrode is disposed on a side of the third gate insulating layer away from the substrate;
 an interlayer dielectric layer, disposed on the second gate insulating layer, wherein the first source electrode, the first drain electrode, the second source electrode, the second drain electrode, and the third electrode plate are disposed on a side of the interlayer dielectric layer away from the substrate, and the first source electrode and the first drain electrode are electrically connected to the first active layer through a first via hole and a second via hole, respectively, and the second source electrode and the second drain electrode are electrically connected to the second active layer through a third via hole and a fourth via hole, respectively;
 a connection electrode, disposed in the same layer as the first source electrode, and connecting the first active layer and the second source electrode through a fifth via hole; and
 a passivation layer, covering the first source electrode, the first drain electrode, the second source electrode, the second drain electrode, the third electrode plate, and the connection electrode.

In the drive substrate provided by the embodiment of the present application, orthographic projections of the first electrode plate, the second electrode plate, and the third electrode plate on the substrate are completely overlapped.

In the drive substrate provided by the present embodiment, the substrate comprises:
 a first flexible layer;
 a first barrier layer, disposed on the first flexible layer;
 a second flexible layer, disposed on a side of the first barrier layer away from the first flexible layer;
 a first buffer layer, disposed on a side of the second flexible layer away from the first barrier layer;
 an antistatic layer, disposed on a side of the first buffer layer away from the second flexible layer, wherein an orthographic projection of the first active layer on the first buffer layer covers an orthographic projection of the antistatic layer on the first buffer layer;
 a second buffer layer, covering the antistatic layer; and
 a second barrier layer, disposed on a side of the second buffer layer away from the first buffer layer, wherein the first active layer is disposed on a side of the second barrier layer away from the second buffer layer.

In the drive substrate provided by the present embodiment, the first active layer comprises a low-temperature polysilicon active layer, where the second active layer comprises a metal oxide active layer.

In the drive substrate provided by the embodiment of the present application, the first active layer comprises a first doped region and a first channel region, wherein the first doped region comprises a P-type doped region, the second active layer comprises a second doped region and a second channel region, and the second doped region comprises a N-type doped region.

In the driving substrate provided by the present embodiment, a distance between the first electrode plate and the second electrode plate ranges from 50 nm to 500 nm, and a distance between the second electrode plate and the third electrode plate ranges from 150 nm to 1500 nm.

An embodiment of the present application further provides a method of manufacturing a drive substrate, wherein the drive substrate comprises a substrate, a first thin film transistor, a second thin film transistor, a first capacitor, and a second capacitor, the first capacitor comprises a first electrode plate and a second electrode plate, and the second capacitor comprises the second electrode plate and a third electrode plate. The method of manufacturing the drive substrate comprises the steps of:
  providing the substrate;
  forming a first gate electrode of the first thin film transistor on the substrate, wherein the first gate electrode is also used as the first electrode plate;
  forming the second electrode plate and a second active layer of the second thin film transistor on the substrate, wherein the second electrode plate is disposed above the first electrode plate, and the first electrode plate and the second electrode plate are at least partially overlapped;
  forming the third electrode plate on the substrate, wherein the third electrode plate is disposed above the second electrode plate, and the second electrode plate and the third electrode plate are at least partially overlapped.

In the manufacturing method of the drive substrate provided in the embodiment of the present application, after the step of providing a substrate, the method further comprises:
  depositing a layer of low temperature polysilicon material on the substrate and treating the low temperature polysilicon material by means of a mask process to form a first active layer; and
  depositing a first gate insulating layer on the first active layer.

In the method for manufacturing a driving substrate provided in the present embodiment, the first gate electrode of the first thin film transistor is formed on the substrate, the first gate electrode is used as the first electrode plate, and the method comprises:
  depositing a first gate conductive layer on the substrate;
  patterning the first gate conductive layer to form the first gate electrode and light shielding layer; and
  forming a second gate insulating layer on the first gate insulating layer.

In the manufacturing method of the driving substrate provided in the embodiment of the present application, the step of forming the second electrode plate and the second active layer of the second thin film transistor on the substrate comprises:
  forming a layer of metal oxide material on the second gate insulating layer, and patterning the metal oxide layer to form patterns of the metal oxide material corresponding to the second electrode plate and the second source electrode, respectively;
  sequentially forming a third gate insulating material layer and a metal layer on the second gate insulating layer;
  then etching the metal layer using a yellow light process to form a second gate electrode;
  etching a third gate electrode insulating material layer in self-alignment with the second gate electrode to form a third gate insulating layer; and
  conductively treating a metal oxide material corresponding to the second electrode plate and a metal oxide material corresponding to the second active layer to form the second electrode plate and the second active layer.

An embodiment of the present application further provides a display panel comprising a light emitting functional layer and a drive substrate, wherein the light emitting functional layer is disposed on the drive substrate, and the drive substrate comprises:
  a substrate;
  a first thin film transistor, disposed on the substrate, wherein the first thin film transistor comprises a first gate electrode;
  a second thin film transistor, disposed on a side of the first thin film transistor;
  a first capacitor, disposed on the substrate, wherein the first capacitor comprises a first electrode plate and a second electrode plate, the second electrode plate is disposed above the first electrode plate, the first electrode plate and the second electrode plate are at least partially overlapped, and the first gate electrode is also used as the first electrode plate; and
  a second capacitor, comprising the second electrode plate and a third electrode plate, wherein the third electrode plate is disposed above the second electrode plate, and the second electrode plate and the third electrode plate are at least partially overlapped.

In the display panel provided in the embodiment of the present application, the first thin film transistor comprises a first active layer, the first gate electrode, a first source electrode and a first drain electrode, wherein the third electrode plate and the first source electrode and the first drain electrode are disposed in the same layer, and the third electrode plate is disposed between the first source electrode and the first drain electrode;
  the second thin film transistor comprises a second active layer, a second gate electrode, a second source electrode, and a second drain electrode, wherein the second source electrode and the first source electrode are disposed in the same layer, and the second electrode plate and the second active layer are disposed in the same layer.

In the display panel provided in the embodiment of the present application, the drive substrate further comprises:
  a first gate insulating layer, disposed on a side of the first active layer away from the substrate, wherein the first gate electrode is disposed on a side of the first gate insulating layer away from the substrate;
  a light shielding layer, disposed in the same layer as the first gate electrode, wherein an orthographic projection of the second active layer on the substrate covers an orthographic projection of the light shielding layer on the substrate;
  a second gate insulating layer covering the first gate electrode and the light shielding layer, wherein the second electrode plate and the second active layer are disposed on a side of the second gate insulating layer away from the substrate;

a third gate insulating layer, disposed on a side of the second active layer away from the substrate, wherein the second gate electrode is disposed on a side of the third gate insulating layer away from the substrate;

an interlayer dielectric layer, disposed on the second gate insulating layer, wherein the first source electrode, the first drain electrode, the second source electrode, the second drain electrode, and the third electrode plate are disposed on a side of the interlayer dielectric layer away from the substrate, the first source electrode and the first drain electrode are electrically connected to the first active layer through a first via hole and a second via hole, respectively, and the second source electrode and the second drain electrode are electrically connected to the second active layer through a third via hole and a fourth via hole, respectively;

a connection electrode, disposed in the same layer as the first source electrode, and connecting the first active layer and the second source electrode through a fifth via hole; and a passivation layer, covering the first source electrode, the first drain electrode, the second source electrode, the second drain electrode, the third electrode plate, and the connection electrode.

In the display panel provided by the embodiment of the present application, orthographic projections of the first electrode plate, the second electrode plate, and the third electrode plate on the substrate are completely overlapped.

In the display panel provided by the present embodiment, the substrate comprises:

a first flexible layer;

a first barrier layer, disposed on the first flexible layer;

a second flexible layer, disposed on a side of the first barrier layer away from the first flexible layer;

a first buffer layer, disposed on a side of the second flexible layer away from the first barrier layer;

an antistatic layer, disposed on a side of the first buffer layer away from the second flexible layer, wherein an orthographic projection of the first active layer on the first buffer layer covers the orthographic projection of the antistatic layer on the first buffer layer;

a second buffer layer, covering the antistatic layer; and a second barrier layer, disposed on a side of the second buffer layer away from the first buffer layer, wherein a first active layer is disposed on a side of the second barrier layer away from the second buffer layer.

In the display panel provided by the present embodiment, the first active layer comprises a low-temperature polysilicon active layer, and the second active layer comprises a metal oxide active layer.

In the display panel provided by the embodiment of the present application, the first active layer comprises a first doped region and a first channel region, the first doped region comprises a P-type doped region, the second active layer comprises a second doped region and a second channel region, and the second doped region comprises an N-type doped region.

In the display panel provided in the embodiment of the present application, the distance between the first electrode plate and the second electrode plate ranges from 50 nm to 500 nm, and the distance between the second electrode plate and the third electrode plate ranges from 150 nm to 1500 nm.

In order to make the foregoing contents of the present application more readily understandable, preferred embodiments are described below and described in detail in conjunction with the accompanying drawings.

Beneficial Effects

Embodiments of the present application provide a drive substrate and a manufacturing method of the drive substrate thereof and a display panel. The drive panel comprises a substrate, a first thin film transistor, a second thin film transistor, a first capacitor and a second capacitor. The first thin film transistor is disposed on the substrate and the first thin film transistor comprises a first gate electrode. The second thin film transistor is disposed on a side of the first thin film transistor. A first capacitor is disposed on the substrate. The first capacitor comprises a first electrode plate and a second electrode plate, the second electrode plate is disposed above the first electrode plate, the first electrode plate and the second electrode plate are at least partially overlapped, and the first gate electrode is also used as the first electrode plate. The second capacitor comprises a second electrode plate and a third electrode plate, the third electrode plate is disposed above the second electrode plate, and the second electrode plate and the third electrode plate are at least partially overlapped.

The driving substrate provided in the embodiment of the present application comprises a first capacitor and a second capacitor, the first gate electrode of the first thin film transistor is also used as a first electrode plate of the first capacitor, and the first capacitor and the second capacitor share a second electrode plate, whereby the first capacitor and the second capacitor constitute a sandwich structure, thereby increasing the capacitor's ability to store charges.

DESCRIPTION OF SPECIFIC EMBODIMENTS OF THE INVENTION

In order to make the purposes, technical solutions and advantages of the present application clearer, the present application will be described in further detail below with reference to the drawings, in which the same component symbols represent the same components. The following description is based on the illustrated embodiments of the present application and should not be construed as limiting other embodiments of the present application which are not detailed herein. The term "Embodiment" used herein means embodiments, examples, or illustrations.

In the context of the description, it should be noted that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise" or the like are based on the azimuth or positional relationship shown in the attached drawings, which are used for demonstrated, not meant that a device or an element must have special the azimuth or positional relationship and cannot be understood to be a limitation to the application. In addition, the terms "first" and "second" are only used for descriptive purposes and cannot be understood as indicating or implying relative importance or implicitly indicating the number of indicated technical features. Thus, the features defined by "first" and "second" may explicitly or implicitly represent they comprise one or more of the features. In the description of this application, "multiple" means two or more, unless otherwise specifically defined.

Embodiments of the present application provide a drive substrate, a manufacturing method thereof, and a display panel. Detailed description will be given below. It should be noted that the order of description of the following embodiments is not a limitation on the preferred order of the embodiments.

An embodiment of the present application provides a drive substrate comprising a substrate, a first thin film transistor, a second thin film transistor, a first capacitor, and a second capacitor. The first thin film transistor comprising a first gate electrode is disposed on the substrate. The second thin film transistor is disposed on one side of the first thin film transistor. The first capacitor is disposed on the substrate. The first capacitor comprises a first electrode plate and a second electrode plate, wherein the second electrode plate is disposed above the first electrode plate, the first electrode plate and the second electrode plate are at least partially overlapped, and the first gate electrode is also used as the first electrode plate. The second capacitor comprises a second electrode plate and a third electrode plate, the third electrode plate being located above the second electrode plate, and the second electrode plate and the third electrode plate at least partially overlap.

The driving substrate provided in the embodiment of the present application comprises a first capacitor and a second capacitor, wherein the first gate electrode of the first thin film transistor is also used as a first electrode plate of the first capacitor, and the first capacitor and the second capacitor share the second electrode plate, whereby the first capacitor and the second capacitor constitute a sandwich structure, thereby increasing the capacitor's ability to store charges.

The drive substrate provided in this application will be described in detail below with reference to the following specific embodiments.

Figure 1:
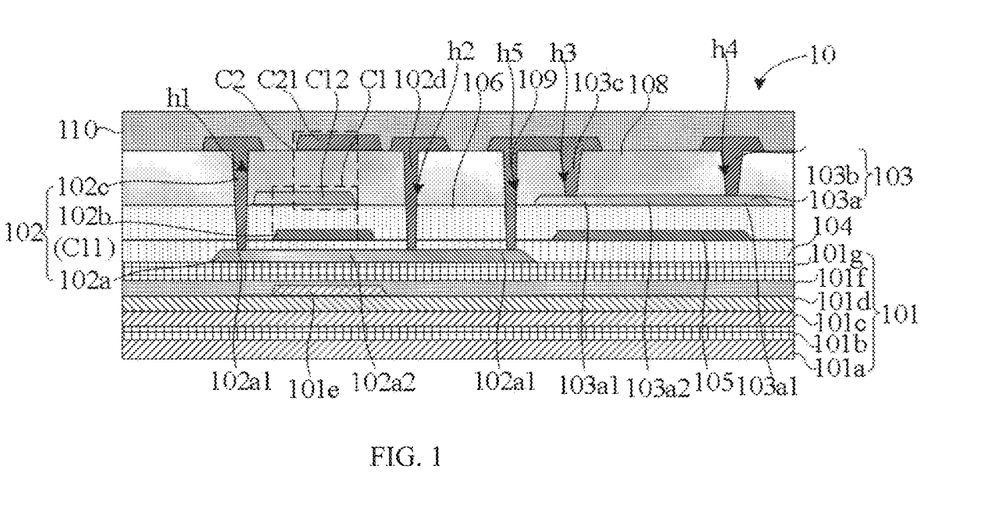
FIG. 1 is a schematic structural diagram of a drive substrate according to a first embodiment of the present application.

Referring to FIG. 1, FIG. 1 is a schematic structural diagram of a drive substrate according to a first embodiment of the present application. The drive substrate comprises a substrate 101, a first thin film transistor 102, a second thin film transistor 103, a first capacitor C1, and a second capacitor C2. The first thin film transistor 102 including a first gate electrode 102b is disposed on the substrate 101. The second thin film transistor 103 is disposed on one side of the first thin film transistor 102. The first capacitor C1 is disposed on the substrate. The first capacitor C1 comprises a first electrode plate C11 and a second electrode plate C12, wherein the second electrode plate C12 is disposed above the first electrode plate C11, the first electrode plate C11 and the second electrode plate C12 are partially overlapped, and the first gate electrode 102b is also used as the first electrode plate C11. The second capacitor C2 comprises a second electrode plate C12 and a third electrode plate C21, the third electrode plate C21 is disposed above the second electrode plate C12, and the second electrode plate C12 and the third electrode plate C21 are partially overlapped.

The driving substrate 10 provided in the embodiment of the present application comprises a first capacitor C1 and a second capacitor C2, the first gate electrode 102b of the first thin film transistor 102 is also used as a first electrode plate C11 of the first capacitor C1, and the first capacitor C1 and the second capacitor C2 share the second electrode plate C12, whereby the first capacitor C1 and the second capacitor C2 constitute a sandwich structure, thereby increasing the capacitor's ability to store charges.

Figure 2:
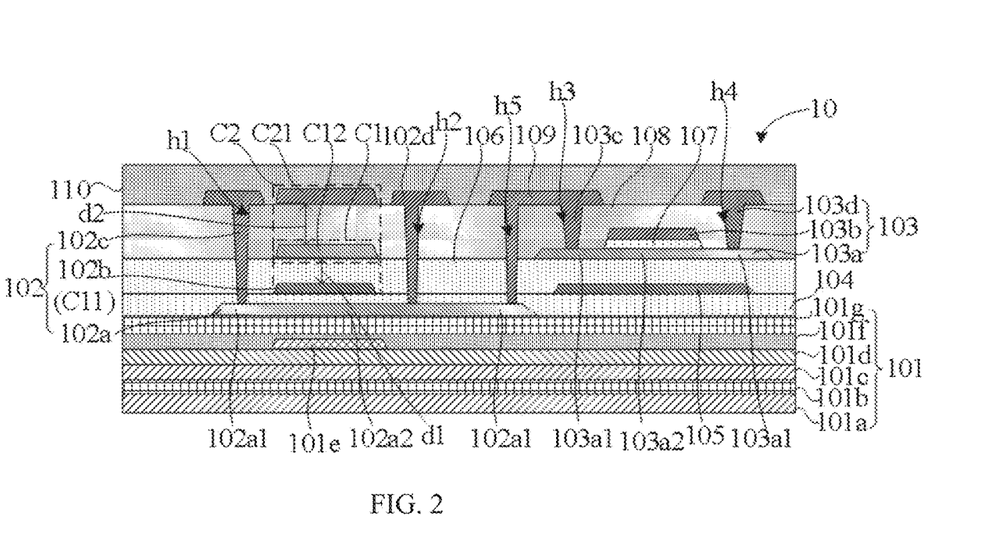
FIG. 2 is a schematic structural diagram of a drive substrate according to a second embodiment of the present application.

Referring to FIG. 2, FIG. 2 is a schematic structural diagram of a drive substrate according to a second embodiment of the present application. The drive substrate 10 comprises a substrate 101, a first thin film transistor 102, a second thin film transistor 103, a first capacitor C1, and a second capacitor C2. The first thin film transistor 102 comprising a first gate electrode 102b is disposed on the substrate 101. The second thin film transistor 103 is disposed on one side of the first thin film transistor 102. The first capacitor C1 is disposed on the substrate. The first capacitor C1 comprises a first electrode plate C11 and a second electrode plate C12, the second electrode plate C12 is disposed above the first electrode plate C11, and the first electrode plate C11 and the second electrode plate C12 are completely overlapped, and the first gate electrode 102b is also used as the first electrode plate C11. The second capacitor C2 comprises a second electrode plate C12 and a third electrode plate C21, the third electrode plate C21 is disposed above the second electrode plate C12, and the second electrode plate C12 and the third electrode plate C21 are completely overlapped. The drive substrate 10 provided in the present embodiment differ from the drive substrate provided in the previous embodiment in that orthographic projections of the first electrode plate C11, the second electrode plate C12 and the third electrode plate C21 on the substrate 101 are completely overlapped.

The driving substrate 10 provided in the embodiment of the present application comprises a first capacitor C1 and a second capacitor C2. The first gate electrode 102b of the first thin film transistor 102 is also used as a first electrode plate C11 of the first capacitor C1, and the first capacitor C1 and the second capacitor C2 share a second electrode plate C12, whereby the first capacitor C1 and the second capacitor C2 constitute a sandwich structure, thereby increasing the capacitor's ability to store charges.

The capacitance C of the capacitor is related to the distance d between the capacitor plates, the dielectric constant E, and the facing area S of the capacitor plates, i.e., $C=\varepsilon S/4\pi k d$, wherein k is an electrostatic force constant. It can be seen that the capacitance of the capacitor is inversely proportional to the distance d between the capacitor plates, and the capacitance of the capacitor is positively proportional to the area S facing the plates. In the present embodiment, the first gate electrode 102b is also used as the first electrode plate C11, and the first electrode plate C11 of the first capacitor C1 is also used as the first electrode plate of the second capacitor so that the total capacitance is the sum of the first capacitor and the second capacitor, that is, the total capacitance C, Ctotal=Ca+Cb, wherein Ca is the capacitance of the first capacitor C1 and Cb is the capacitance of the second capacitor C2. Thus, in the case where the distance d between the two electrode plates of the capacitor is not changed, the capacitance of capacitors having a larger positive-facing area can be obtained only by the first capacitor and the second capacitor having a larger positive-facing area of the two electrode plates, so that the occupied area of the driving substrate can be further reduced. Further, the thickness of the drive substrate 10 can be reduced while the occupied area of the drive substrate 10 is reduced, thereby facilitating the development of a light and thin display panel.

Further, referring to FIG. 2, the distance d1 between the first plate C11 and the second plate C12 ranges from 50 nm to 500 nm, and the distance d2 between the second plate C12 and the third plate C21 ranges from 150 nm to 1500 nm. In some embodiments, the distance d1 between the first plate C11 and the second plate C12 may be any one of 50 nm, 65 nm, 65 nm, 105 nm, 125 nm, 165 nm, 225 nm, 365 nm, 415 nm, or 500 nm. The distance d2 between the second plate C12 and the third plate C21 may be any one of 150 nm, 250 nm, 350 nm, 550 nm, 750 nm, 950 nm, 1150 nm, 1350 nm, 1450 nm, or 1500 nm.

Since the capacitance of the capacitor is directly proportional to the facing area between the two electrode plates of the capacitor and inversely proportional to the distance between the two electrode plates, the positive area between the two electrode plates of the capacitor is proportional to the area between the two electrode plates of the capacitor, and the capacitance of the capacitor can be increased by reducing the distance between the two electrode plates of the capacitor. By using the first gate electrode 102b as the first electrode plate C11 so that the distances among the first electrode plate C11, the second electrode plate C12, and the third electrode plate C21 are small, it is possible to further reduce the occupancy size of the capacitance in the drive substrate 10 on the premise of ensuring the total capacitance, thereby achieving a light and thin display panel.

In the drive substrate 10 provided in the embodiment of the application, the substrate 101 comprises a first flexible layer 101a, a first barrier layer 101b, a second flexible layer 101c, a first buffer layer 101d, an anti-static layer 101e, a second buffer layer 101f, and a second barrier layer 101g. The first barrier layer 101b is disposed on the first flexible layer 101a. The second flexible layer 101c is disposed on a side of the first barrier layer 101b away from the first flexible layer 101a. The first buffer layer 101d is disposed on a side of the second flexible layer 101c away from the first barrier layer 101b. The antistatic layer 101e is disposed on a side of the first buffer layer 101d away from the second flexible layer 101c, and the orthographic projection of the first active layer 102a on the first buffer layer 101d covers the orthographic projection of the antistatic layer 101e on the first buffer layer 101d. The second buffer layer 101f covers the antistatic layer 101e. The second barrier layer 101g is disposed on a side of the second buffer layer 101f away from the first buffer layer 101d, and the first active layer 102a is disposed on a side of the second barrier layer 101g away from the second buffer layer 101f.

The first barrier layer 101b serves to prevent water oxygen from penetrating the first flexible layer 101a onto the first barrier layer 101b, preventing damage to the drive substrate 10. In some embodiments, the material of the first barrier layer 101b comprises, but is not limited to, silicon-containing oxides, nitrides, or nitrogen oxides. For example, the material of the first barrier layer 101b is at least one of SiOx, SiNx, or SiOxNy. The material of the first flexible layer 101a may be the same as that of the second flexible layer 101c, which may comprise at least one of PI (polyimide), PET (polyethylene dicarbonate), PEN (polyethylene naphthalate), PC (polycarbonate), PES (polyethersulfone), PAR (aromatic fluorotoluene containing polyaromatic esters), or PCO (polycyclic olefins).

In some embodiments, the materials of the first buffer layer 101d and the second buffer layer 101f comprises, but are not limited to, silicon-containing oxides, nitrides, or nitrogen oxides. For example, the first buffer layer 101d and the second buffer layer 101f are made from at least one of SiOx, SiNx, or SiOxNy. The material of the antistatic layer 101e may be an amorphous silicon material, and the antistatic layer 101e serves to improve static electricity.

In some embodiments, the second barrier layer 101g may be a silicon nitride layer and a silicon oxide layer disposed in a stack, wherein the silicon nitride layer is used to block water oxygen from being invaded from the first flexible layer 101a side, thereby causing damage to the film layer(s) over the driving substrate 10, and the silicon oxide layer is used to keep the temperature of the thin film transistors over the driving substrate 10.

The first thin film transistor 102 comprises a first active layer 102a, a first gate electrode 102b, a first source electrode 102c, and a first drain electrode 102d. The third electrode plate C21 is disposed in the same layer as the first source electrode 102c and the first drain electrode 102d, and the third electrode plate C21 is disposed between the first source electrode 102c and the first drain electrode 102d. The second thin film transistor 103 comprises a second active layer 103a, a second gate electrode 103b, a second source electrode 103c, and a second drain electrode 103d. The second source electrode 103c and the first source electrode 102c are disposed in the same layer, and the second electrode plate C12 and the second active layer 103a are disposed in the same layer. The drive substrate further comprises a first gate insulating layer 104, a light shielding layer 105, a second gate insulating layer 106, a third gate insulating layer 107, an interlayer dielectric layer 108, a connection electrode 109, and a passivation layer 110.

A first gate insulating layer 104 is disposed on a side of the first active layer 102a away from the substrate 101, and a first gate electrode 102b is disposed on a side of the first gate insulating layer 104 away from the substrate 101. The light shielding layer 105 is disposed in the same layer as the first gate electrode 102b, and the orthographic projection of the second active layer 103a on the substrate 101 covers the orthographic projection of the light shielding layer 105 on the substrate 101. The second gate insulating layer 106 covers the first gate electrode 102b and the light shielding layer 105, and the second electrode plate C12 and the second active layer 103a are located on a side of the second gate insulating layer 106 away from the substrate 101. The third gate insulating layer 107 is located on the side of the second active layer 103a away from the substrate 101, and the second gate electrode 103b is located on the side of the third gate insulating layer 107 away from the substrate 101. The interlayer dielectric layer 108 is disposed on the second gate insulating layer 106, and the first source electrode 102c, the first drain electrode 102d, the second source electrode 103c, the second drain electrode 103d, and the third electrode plate C21 are located (disposed) on a side of the interlayer dielectric layer 108 away from the substrate 101. The first source electrode 102c and the first drain electrode 102d are electrically connected to the first active layer 102a through a first via hole h1 and a second via hole h2, respectively. The second source electrode 103c and the second drain electrode 103d are electrically connected to the second active layer 103a through a third via h3 and a fourth via h4, respectively. The connection electrode 109 is disposed in the same layer as the first source electrode 102c, and is connected to the first active layer 102a and the second source electrode 103c through the fifth via hole h5. The passivation layer 110 covers the first source electrode 102c, the first drain electrode 102d, the second source electrode 103c, the second drain electrode 103d, the third electrode plate C21, and the connection electrode 109.

It should be noted that the thickness of the first gate insulating layer 104, the second gate insulating layer 106, or the third gate insulating layer 107 each ranges from 100 nm to 300 nm.

In some embodiments, the materials of the first gate electrode 102b, the second gate electrode 103b, the light shielding layer 105, the first source electrode 102c, the second source electrode 103c, the first drain electrode 102d, the second drain electrode 103d, or the like comprise one or more of silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), or scandium (Sc). The material of the first gate insulating layer 104, the second gate insulating layer 106, the interlayer dielectric layer 108, the third gate insulating layer 107, or the passivation layer 110 comprises one of silicon oxide, silicon nitride, or silicon oxynitride or any combination thereof. The material of the second electrode plate C12 comprises a conductive metal oxide material.

In some embodiments, the thickness of the first gate electrode 102b is less than or equal to 1000 nm. The thickness of the second active layer 103a is less than or equal to 120 nm. The thickness of the interlayer dielectric layer 108 ranges from 100 nm to 120 nm. The thickness of the first source electrode 102c, the first drain electrode 102d, the second source electrode 103c, the second drain electrode 103d, the third electrode plate C21, or the connection electrode 109 each ranges from 100 nm to 1000 nm.

It should be noted that the first gate electrode 102b and the light shielding layer 105 of the embodiment of the present application are formed by the same mask process. The second electrode plate C12 and the second active layer 103a are formed by the same mask process. The third electrode plate C21 and the first source electrode 102c are formed by the same mask process.

In the drive substrate 10 provided in the embodiments of the application, since the first gate electrode 102b is also used as the first electrode plate C11, the second electrode plate C12 and the second active layer 103a are disposed in the same layer, the second electrode plate C12 and the second active layer 103a are formed through the same mask process, and the third electrode plate C21 and the first source electrode 102c are formed through the same mask process, the driving substrate provided in the embodiment of the present application reduces a step of fabricating a gate electrode and a step of depositing an interlayer dielectric layer, thereby reducing a mask and achieving a lightening and thinning of the driving substrate as compared with the conventional driving substrate.

In the drive substrate provided by the present embodiment, the first active layer 102a comprises a low-temperature polysilicon active layer, and the second active layer 103a comprises a metal oxide active layer. In one embodiment, the material of the second active layer 103a may be one of indium gallium zinc oxide, indium zinc tin oxide, or indium gallium zinc tin oxide or any combination thereof. The LTPO (Low Temperature Polycrystalline Oxide) drive substrate, that is, the LTPO drive substrate technology obtained by combining the LTPS drive substrate technology and the Oxide drive substrate technology, has advantages of high resolution, high reaction speed, high brightness, high aperture ratio, and the like of the LTPS drive substrate, and also has advantages of low production cost and low power consumption. In one embodiment, the first thin film transistor 102 may function as a driving thin film transistor in the pixel driving circuit, and the second thin film transistor 103 may function as a switching thin film transistor in the pixel driving circuit.

In the driving substrate 10 provided by the present embodiment, the first active layer 102a comprises a first doped region 102a1 including a P-type doped region and a first channel region 102a2. The second active layer 103a comprises a second doped region 103a1 including an N-type doped region and a second channel region 103a2.

The driving substrate 10 provided in the embodiment of the present application uses the first gate electrode 102b also as the first electrode plate C11 of the first capacitor C1, and the first capacitor C1 and the second capacitor C2 share the second electrode plate C12, whereby the first capacitor C1 and the second capacitor C2 constitute a sandwich structure, thereby increasing the capacitor's ability to store charges. In addition, since the second electrode plate C12 and the second active layer 103a are disposed in the same layer and manufactured by the same masking process, and the third electrode plate C21 and the first source electrode 102c are disposed in the same layer and manufactured by the same masking process, the driving substrate 10 provided in the embodiment of the present application also saves a mask and achieves lightening and thinning of the driving substrate 10.

Figure 3:
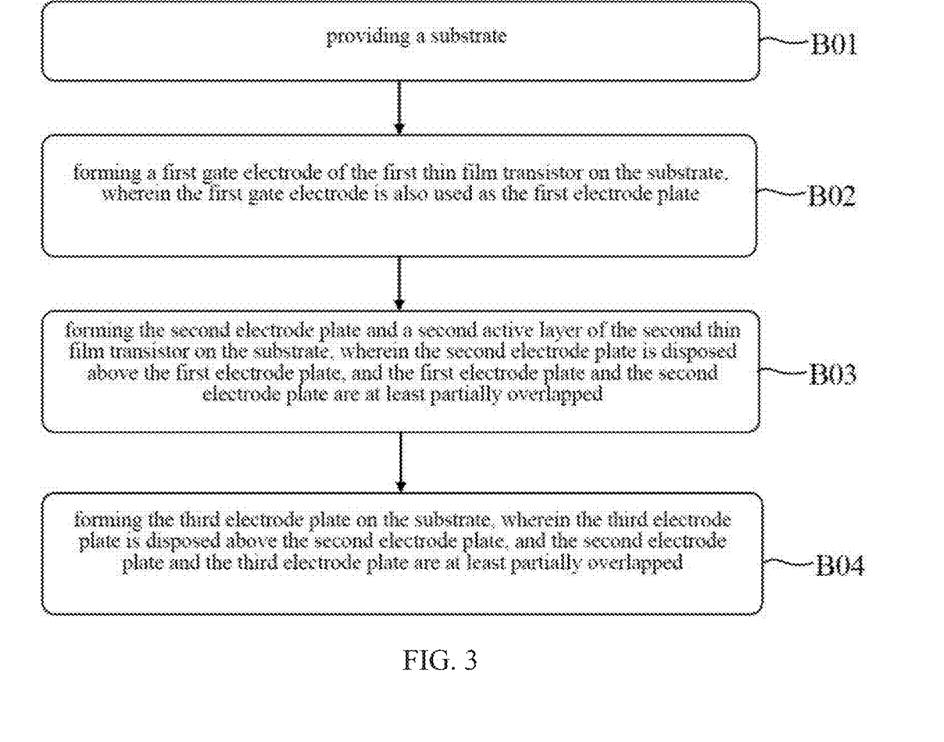
FIG. 3 is a flowchart of steps of a method for manufacturing a drive substrate according to a second embodiment of the present application.

Referring to FIG. 1, FIG. 2, and FIG. 3, an embodiment of the present application further provides a method of manufacturing a drive substrate. FIG. 3 is a flowchart of steps of the method of manufacturing a drive substrate according to the second embodiment of the present application. In the embodiment, the driving substrate comprises a first thin film transistor 102, a second thin film transistor 103, a first capacitor C1 and a second capacitor C2, the first capacitor C1 comprises a first electrode plate C11 and a second electrode plate C12, the second capacitor C2 comprises a second electrode plate C12 and a third electrode plate C21, and the manufacturing method of the driving substrate comprises the following steps:

Step B01, a substrate 101 is provided. Please refer to FIG. 4.

Figure 4:
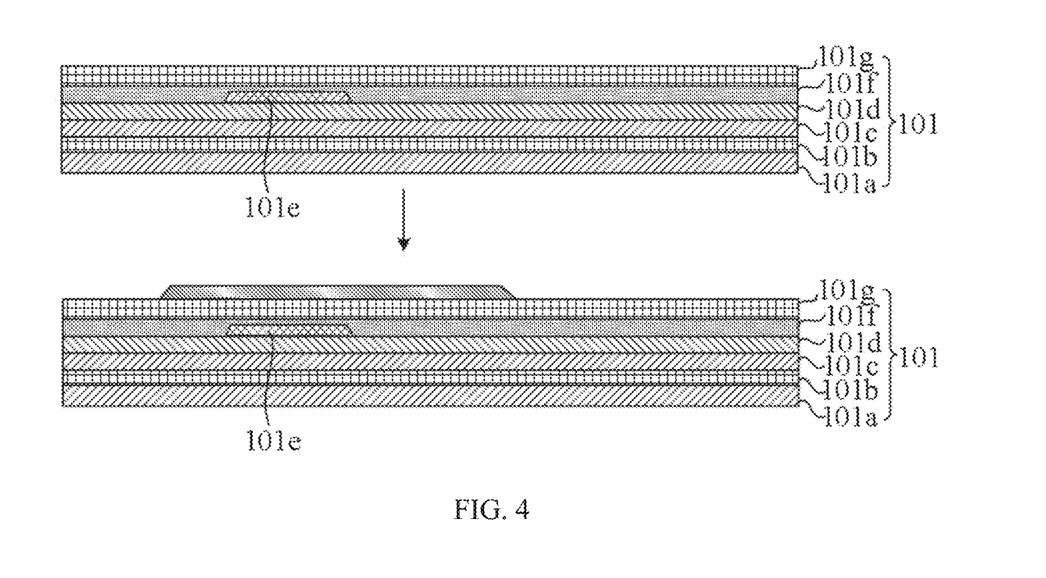
FIGS. 4, 5, 6 and 7 are schematic diagrams for providing a method of manufacturing a drive substrate according to a second embodiment of the present application.

The substrate 101 comprises a first flexible layer 101a, a first barrier layer 101b, a second flexible layer 101c, a first buffer layer 101d, an anti-static layer 101e, a second buffer layer 101f, and a second barrier layer 101g, which are laminated in this order.

After step B01, depositing a layer of low temperature polysilicon material on the substrate 101 and processing the low temperature polysilicon material using a first mask process to form a first active layer 102a.

Thereafter, a first gate insulating layer 104 may be deposited on the first active layer 102a. The material of the first gate insulating layer 104 may be one of silicon oxide, silicon nitride, a high dielectric constant dielectric material (such as aluminum oxide, hafnium oxide, zirconium oxide, and the like) and organic dielectric materials, and any combinations thereof. The thickness of the first gate insulating layer 104 may be 500 nm-1000 nm, in particular 600 nm. The first gate insulating layer 104 may be formed using plasma chemical vapor deposition, magnetron sputtering or reactive sputtering, atomic layer deposition, spin coating, or the like.

Figure 5:
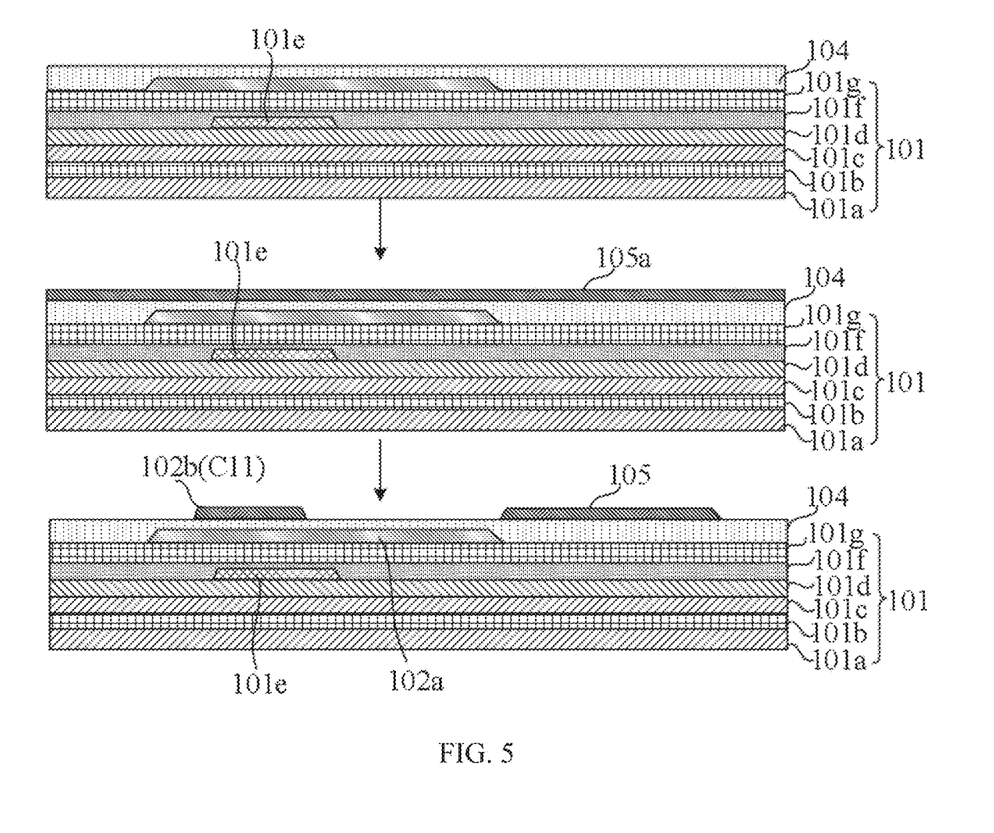

Step B02, the first gate electrode 102b of the first thin film transistor is formed on the substrate 101, and the first gate electrode 102b is also used as the first electrode plate C11.

Specifically, a first gate conductive layer 105a is first deposited on the substrate 101. The first gate conductive layer 105a may constitute a single metal layer or a multilayer metal layer using elemental or alloy materials selected from molybdenum (Mo), copper (Cu), aluminum (Al), titanium (Ti), and chromium (Cr). The first gate conductive layer 105a may also use one of non-reflective materials, such as conductive metal oxides (e.g., ITO) or other conductive materials, or any combinations thereof. The thickness of the first gate conductive layer 105a may be 10 nm-800 nm, in particular 200 nm. The first gate conductive layer 105a may be formed on the substrate 101 using techniques such as magnetron sputtering, reactive sputtering, thermal evaporation, and electron evaporation. The reflection here refers to a transmittance of at least less than 20%. Then, the first gate conductive layer 105a may be patterned to form the first gate electrode 102b and the light shielding layer 105. Specifically, a photoresist is spin-coated on the first gate conductive layer 105a, followed by photolithography, degumming, cleaning, and the like to obtain the patterned first gate electrode 102b and the light shielding layer 105.

After step B02, a second gate insulating layer 106 is formed on the first gate insulating layer 104.

Specifically, a second gate insulating layer 106 is deposited on the first gate insulating layer 104. The material of the second gate insulating layer 106 may be one or a combination of silicon oxide, silicon nitride, a high dielectric constant dielectric material such as aluminum oxide, hafnium oxide, zirconium oxide, and the like, and an organic dielectric material. The thickness of the second gate insulating layer 106 may be 500 nm-1000 nm, in particular 600 nm. The second gate insulating layer 106 may be formed using plasma chemical vapor deposition, magnetron sputtering or reactive sputtering, atomic layer deposition, spin coating, or the like.

Step B03, the second active layer 103a of the second thin film transistor and the second electrode plate C12 are formed on the substrate 101. The second plate C12 is located above the first plate C11, and the first plate C11 and the second plate C12 are at least partially overlapped. Please continue to refer to FIG. 6.

Figure 6:
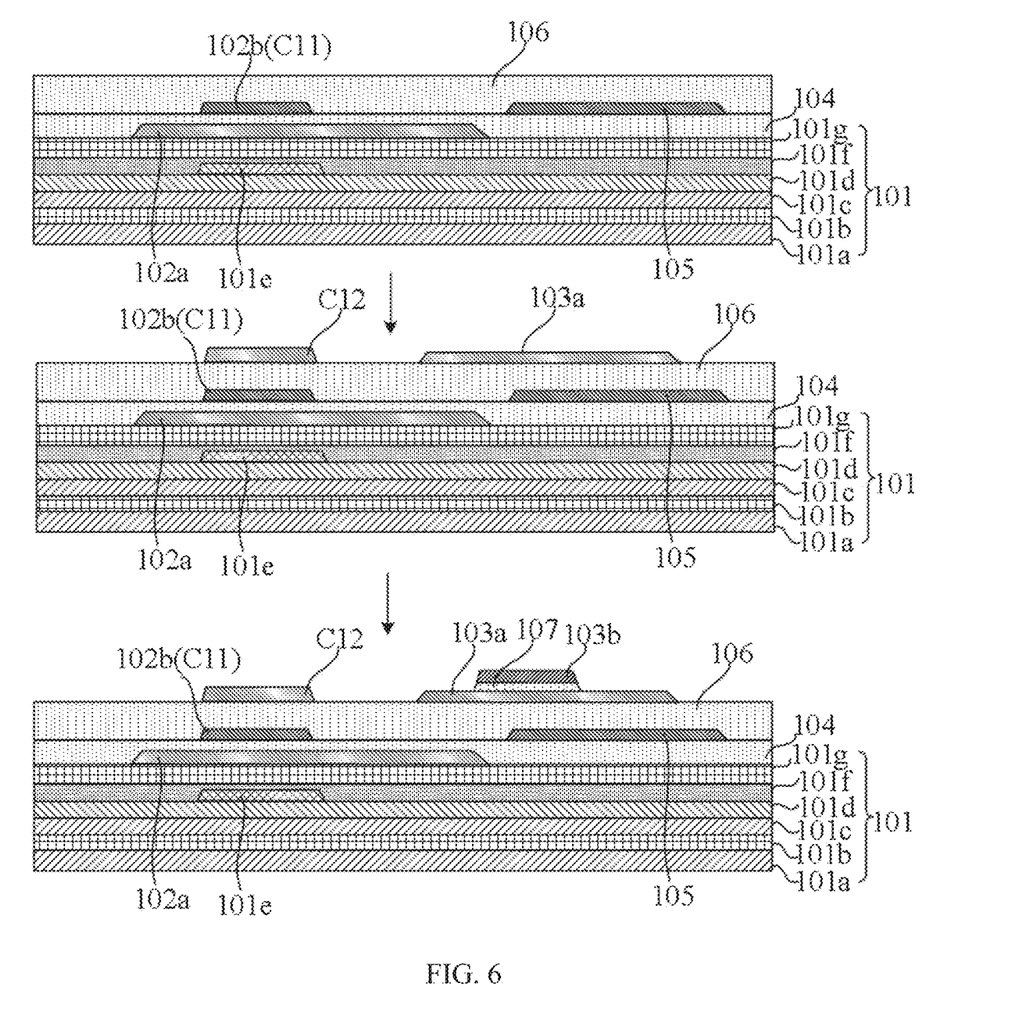

Specifically, Step B03 comprises the following steps:
first, a metal oxide material layer is formed on the second gate insulating layer 106, and the metal oxide layer is patterned to form a metal oxide material corresponding to the second electrode plate C12 and a metal oxide material corresponding to the second source electrode 103c. Subsequently, a third gate electrode insulating material layer and a metal layer are sequentially formed on the second gate insulating layer 106. The metal layer is then etched using a yellow light process to form the second gate electrode 103b. Next, the third gate electrode insulating material layer is etched in self-alignment with the second gate electrode 103b to form the third gate insulating layer 107. Finally, a conductive treatment is performed on the metal oxide material area corresponding to the second electrode plate C12 and the metal oxide material area corresponding to the second active layer 103a to form the second electrode plate C12 and the second active layer 103a.

Step B04: a third electrode plate C21 is formed on the substrate 101. The third electrode plate C21 is disposed above the second electrode plate C12A. The second pole plate C12 and the third pole plate C21 overlap at least partially, see FIG. 7.

Figure 7:
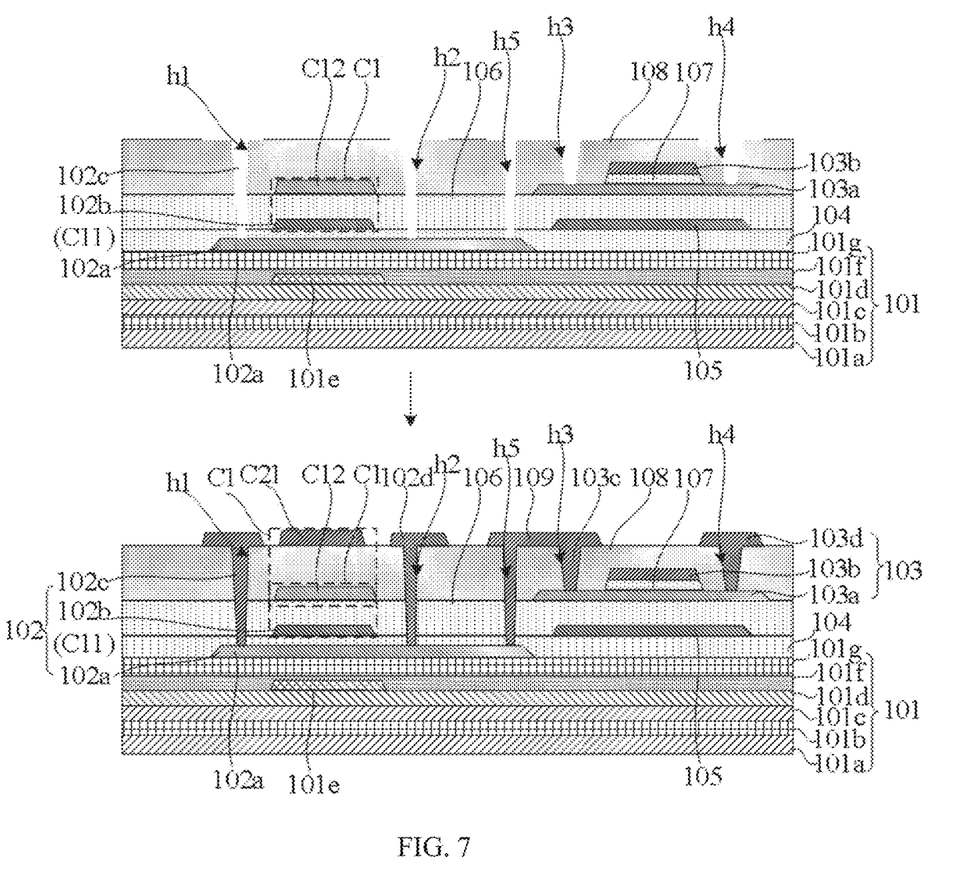

Step B04 specifically comprises, first, depositing an interlayer dielectric layer 108 on the substrate 101 using a plasma chemical vapor deposition method. The material of the interlayer dielectric layer 108 may be one or a combination of silicon oxide, silicon nitride, a high dielectric constant dielectric material such as aluminum oxide, hafnium oxide, zirconium oxide, or the like, and an organic dielectric material, and the thickness of the interlayer dielectric layer 108 may be 100 nm-1200 nm, particularly 400 nm. Subsequently, the first via h1, the second via h2, the third via h3, the fourth via h4, and the fifth via h5 each is formed by a yellow light process. The first via h1, the second via h2, and the fifth via h5 penetrate through the interlayer dielectric layer 108, the second gate insulating layer 106, and the first gate insulating layer 104. The third via h3 and the fourth via h4 penetrate through the interlayer dielectric layer 108. The first via h1 may be a first source electrode 102c contact hole, the second via h2 may be a second drain electrode 103d contact hole. Subsequently, a metal layer is formed on the interlayer dielectric layer 108, and patterned to form the first source electrode 102c, the first drain electrode 102d, the second source electrode 103c, the second drain electrode 103d, the third electrode plate C21, and the connection electrode 109.

After step B04, a passivation layer 110 is formed on the interlayer dielectric layer 108. Specifically, a passivation layer 110 is deposited on the substrate 101 by plasma chemical vapor deposition. The material of the passivation layer 110 may be one or a combination of silicon oxide, silicon nitride, a high dielectric constant dielectric material such as aluminum oxide, hafnium oxide, zirconium oxide, or the like, and an organic dielectric material, and the thickness of the passivation layer 110 may be 50 nm-800 nm, in particular 400 nm.

In the manufacturing method of the driving substrate provided in the embodiment of the present application, first, the first gate electrode 102b and the light shielding layer 105 are formed by the same mask process, and the first gate electrode 102b is also used as the first electrode plate C11. Next, the second active layer 103a and the second electrode plate C12 are formed by the same mask process, and the first capacitor C1 and the second capacitor C2 share the second electrode plate C12, and the second electrode plate C12 is made conductive while conducting the second doped regions of the second source electrode 103c and the second drain electrode 103d, thereby forming the second electrode plate C12. Finally, the first source electrode 102c and the third electrode plate C21 are formed by the same mask process. The manufacturing method of the drive substrate provided in the embodiment of the present application not only increases the capacity of the capacitor to store electric charges, but also reduces a step of producing a gate electrode and a step of producing interlayer dielectric layer, thereby saving the cost of manufacturing the drive substrate and realizing the lightening and thinning of the drive substrate.

Figure 8:
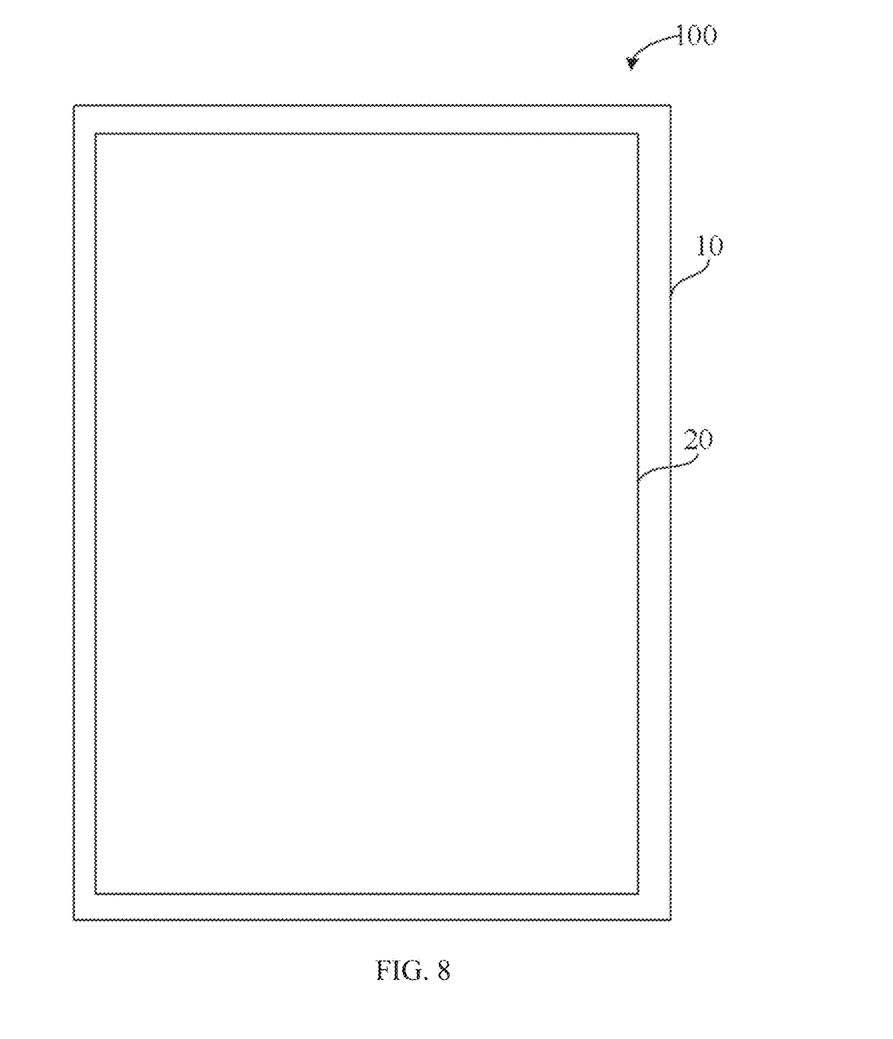
FIG. 8 is a schematic plan view of a display panel according to an embodiment of the present application.

Referring to FIG. 8, an embodiment of the present application further provides a display panel, and the display panel 100 includes a driving substrate 10 and a light-emitting function layer 20. The light-emitting function layer 20 is arranged on the driving substrate 10. The light-emitting function layer 20 may include an anode, a pixel definition layer, a light-emitting layer and a cathode.

The drive substrate 10 is the drive substrate described in the above embodiment, and details are not described herein.

It should be noted that the display panel 100 may be an active light emitting type display panel, such as an organic light emitting diode (OLED) display panel, an active matrix organic light emitting diode (AMOLED) display panel, a passive matrix organic light emitting diode (PMOLED) display panel, a quantum dot organic light emitting diode (QLED) display panel, a micro light emitting diode (Micro-LED) display panel, and a mini light-emitting diode (Mini-LED) display panel.

In view of the above, although the present application has been disclosed in the above preferred embodiment, the above preferred embodiment is not intended to limit the present application. A person of ordinary skill in the art may make various changes and finishes without departing from the spirit and scope of the present application. Therefore, the scope of protection of the present application is subject to the scope defined by the claims.

What is claimed is:

1. A drive substrate comprising:
   a substrate;
   a first thin film transistor disposed on the substrate and comprising a first active layer, a first gate electrode, a first source electrode and a first drain electrode;
   a second thin film transistor disposed on one side of the first thin film transistor;
   wherein the second thin film transistor comprises a second active layer, a second gate electrode, a second source electrode, and a second drain electrode, wherein the second source electrode and the first source electrode are disposed in the same layer, and the second electrode plate and the second active layer are disposed in the same layer;
   a first capacitor disposed on the substrate, wherein the first capacitor comprises a first electrode plate and a second electrode plate, the second electrode plate is located above the first electrode plate, and the first electrode plate and the second electrode plate are at least partially overlapped, wherein the first gate electrode is also used as the first electrode plate;
   a second capacitor, comprising the second electrode plate and a third electrode plate, wherein the third electrode plate is disposed above the second electrode plate, and the second electrode plate and the third electrode plate are at least partially overlapped;
   a first gate insulating layer disposed on a side of the first active layer away from the substrate, wherein the first gate electrode is disposed on a side of the first gate insulating layer away from the substrate;
   a light shielding layer disposed in the same layer as the first gate electrode, wherein an orthographic projection of the second active layer on the substrate covers an orthographic projection of the light shielding layer on the substrate;
   a second gate insulating layer covering the first gate electrode and the light shielding layer, wherein the second electrode plate and the second active layer are disposed on a side of the second gate insulating layer away from the substrate;
   a third gate insulating layer disposed on a side of the second active layer away from the substrate, wherein the second gate electrode is disposed on a side of the third gate insulating layer away from the substrate;
   an interlayer dielectric layer disposed on the second gate insulating layer, wherein the first source electrode, the first drain electrode, the second source electrode, the second drain electrode, and the third electrode plate are disposed on the side of the interlayer dielectric layer away from the substrate, and the first source electrode and the first drain electrode are electrically connected to the first active layer through a first via hole and a second via hole, respectively, and the second source electrode and the second drain electrode are electrically connected to the second active layer through a third via hole and a fourth via hole, respectively; and
   a connection electrode disposed in the same layer as the first source electrode and connecting the first active layer and the second source electrode through a fifth via hole; and
   a passivation layer covering the first source electrode, the first drain electrode, the second source electrode, the second drain electrode, the third electrode plate, and the connection electrode;
   wherein the third electrode plate, the first source electrode and the first drain electrode are disposed in the same layer, and the third electrode plate is disposed between the first source electrode and the first drain electrode.

2. The drive substrate according to claim 1, wherein orthographic projections of the first electrode plate, the second electrode plate, and the third electrode plate on the substrate are completely overlaps.

3. The drive substrate according to claim 1, wherein the substrate comprises:
   a first flexible layer;
   a first barrier layer, disposed on the first flexible layer;
   a second flexible layer, disposed on a side of the first barrier layer away from the first flexible layer;
   a first buffer layer, disposed on a side of the second flexible layer away from the first barrier layer;
   an antistatic layer, disposed on a side of the first buffer layer away from the second flexible layer, wherein an orthographic projection of the first active layer on the first buffer layer covers an orthographic projection of the antistatic layer on the first buffer layer;
   a second buffer layer, covering the antistatic layer; and
   a second barrier layer, disposed on a side of the second buffer layer away from the first buffer layer, wherein the first active layer is disposed on a side of the second barrier layer away from the second buffer layer.

4. The drive substrate according to claim 1, wherein the first active layer comprises a low temperature polysilicon active layer, and the second active layer comprises a metal oxide active layer.

5. The drive substrate according to claim 1, wherein the first active layer comprises a first doped region and a first channel region, the first doped region comprises a P-type doped region, the second active layer comprises a second doped region and a second channel region, and the second doped region comprises a N-type doped region.

6. The driving substrate according to claim 1, wherein a distance between the first electrode plate and the second electrode plate ranges from 50 nm to 500 nm, and a distance between the second electrode plate and the third electrode plate ranges from 150 nm to 1500 nm.

7. A method of manufacturing a drive substrate comprising a substrate, a first thin film transistor, a second thin film transistor, a first capacitor, and a second capacitor, wherein the first capacitor comprises a first electrode plate and a second electrode plate, and the second capacitor comprises the second electrode plate and a third electrode plate, wherein the method of manufacturing the drive substrate comprises:

providing the substrate;
depositing a layer of low temperature polysilicon material on the substrate and treating the low temperature polysilicon material using a mask process to form a first active layer;
depositing a first gate insulating layer on the first active layer;
depositing a first gate conductive layer on the substrate;
patterning the first gate conductive layer to form a first gate electrode and a light shielding layer; wherein the first gate electrode is also used as the first electrode plate;
forming a second gate insulating layer on the first gate insulating layer;
forming the second electrode plate and a second active layer of the second thin film transistor on the substrate, wherein the second electrode plate is disposed above the first electrode plate, and the first electrode plate and the second electrode plate are at least partially overlapped; and
forming the third electrode plate on the substrate, wherein the third electrode plate is disposed above the second electrode plate, and the second electrode plate and the third electrode plate are at least partially overlapped.

8. The method of manufacturing a drive substrate according to claim 7, wherein the step of forming the second electrode plate and a second active layer of the second thin film transistor on the substrate comprises:
forming a metal oxide material layer on the second gate insulating layer, and patterning the metal oxide layer to form patterns of the metal oxide material corresponding to the second electrode plate and the metal oxide material corresponding to the second source electrode;
sequentially forming a third gate electrode insulating material layer and a metal layer on the second gate insulating layer;
etching the metal layer using a yellow light process to form a second gate electrode;
etching the third gate electrode insulating material layer in self-alignment with the second gate electrode to form a third gate insulating layer; and
conductively treating the patterns of the metal oxide material corresponding to the second electrode plate and the metal oxide material corresponding to the second active layer to form the second electrode plate and the second active layer.

9. A display panel comprising a light emitting functional layer and a drive substrate on which the light emitting layer is disposed, wherein the drive substrate comprises:
a substrate;
a first thin film transistor disposed on the substrate and comprising a first gate electrode;
a second thin film transistor disposed on one side of the first thin film transistor;
a first capacitor disposed on the substrate, wherein the first capacitor comprises a first electrode plate and a second electrode plate, the second electrode plate is disposed above the first electrode plate, and the first electrode plate and the second electrode plate are at least partially overlapped, wherein the first gate electrode is also used as the first electrode plate;
a second capacitor comprising the second electrode plate and a third electrode plate, wherein the third electrode plate is disposed above the second electrode plate, and the second electrode plate and the third electrode plate are at least partially overlapped;
a first gate insulating layer disposed on a side of the first active layer away from the substrate, wherein the first gate electrode is disposed on a side of the first gate insulating layer away from the substrate;
a light shielding layer disposed in the same layer as the first gate electrode, wherein an orthographic projection of the second active layer on the substrate covers an orthographic projection of the light shielding layer on the substrate;
a second gate insulating layer covering the first gate electrode and the light shielding layer, wherein the second electrode plate and the second active layer are disposed on a side of the second gate insulating layer away from the substrate;
a third gate insulating layer disposed on a side of the second active layer away from the substrate, wherein the second gate electrode is disposed on a side of the third gate insulating layer away from the substrate;
an interlayer dielectric layer disposed on the second gate insulating layer, wherein the first source electrode, the first drain electrode, the second source electrode, the second drain electrode, and the third electrode plate are disposed on a side of the interlayer dielectric layer away from the substrate, and the first source electrode and the first drain electrode are electrically connected to the first active layer through a first via hole and a second via hole, respectively, and the second source electrode and the second drain electrode are electrically connected to the second active layer through a third via hole and a fourth via hole, respectively;
a connection electrode disposed in the same layer as the first source electrode and connecting the first active layer and the second source electrode through a fifth via hole; and
a passivation layer covering the first source electrode, the first drain electrode, the second source electrode, the second drain electrode, the third electrode plate, and the connection electrode;
wherein the first thin film transistor comprises the first active layer, the first gate electrode, the first source electrode and the first drain electrode; wherein the third electrode plate, the first source electrode and the first drain electrode are disposed in the same layer, and the third electrode plate is disposed between the first source electrode and the first drain electrode; and
the second thin film transistor comprises the second active layer, the second gate electrode, the second source electrode, and the second drain electrode, wherein the second source electrode and the first source electrode are disposed in the same layer, and the second electrode plate and the second active layer are disposed in the same layer.

10. The display panel according to claim 9, wherein orthographic projections of the first plate, the second plate, and the third plate on the substrate completely overlap.

11. The display panel according to claim 9, wherein the substrate comprises:
a first flexible layer;
a first barrier layer, disposed on the first flexible layer;
a second flexible layer, disposed on a side of the first barrier layer away from the first flexible layer;
a first buffer layer, disposed on a side of the second flexible layer away from the first barrier layer;
an antistatic layer, disposed on a side of the first buffer layer away from the second flexible layer, wherein an orthographic projection of the first active layer on the first buffer layer covers an orthographic projection of the antistatic layer on the first buffer layer;

a second buffer layer, covering the antistatic layer;

a second barrier layer, disposed on a side of the second buffer layer away from the first buffer layer, wherein the first active layer is disposed on a side of the second barrier layer away from the second buffer layer.

12. The display panel according to claim 9, wherein the first active layer comprises a low temperature polysilicon active layer and the second active layer comprises a metal oxide active layer.

13. The display panel according to claim 9, wherein the first active layer comprises a first doped region and a first channel region, the first doped region comprises a P-type doped region, the second active layer comprises a second doped region and a second channel region, and the second doped region comprises a N-type doped region.

14. The display panel according to claim 9, wherein a distance between the first electrode plate and the second electrode plate ranges from 50 nm to 500 nm, and a distance between the second electrode plate and the third electrode plate ranges from 150 nm to 1500 nm.

* * * * *